United States Patent
Gilman et al.

[11] Patent Number: 6,164,519
[45] Date of Patent: Dec. 26, 2000

[54] METHOD OF BONDING A SPUTTERING TARGET TO A BACKING PLATE

[75] Inventors: Paul S. Gilman, Suffern, N.Y.; Shailesh Kulkarni, New Milford, N.J.; Jean Pierre Blanchet, Venerque, France

[73] Assignee: Praxair S.T. Technology, Inc., Danbury, Conn.

[21] Appl. No.: 09/349,285

[22] Filed: Jul. 8, 1999

[51] Int. Cl.⁷ ................................................. B23K 20/08
[52] U.S. Cl. ........................................... 228/107; 228/160
[58] Field of Search ............................. 228/107, 122.1, 228/2.5, 159, 160

[56] References Cited

U.S. PATENT DOCUMENTS

| | | |
|---|---|---|
| 3,186,083 | 6/1965 | Wright, Jr. . |
| 4,024,044 | 5/1977 | Brannan et al. . |
| 4,349,424 | 9/1982 | Sovey et al. . |
| 4,468,313 | 8/1984 | Okumura et al. ........................ 204/298 |
| 5,009,765 | 4/1991 | Qamar et al. ........................ 204/298.12 |
| 5,143,590 | 9/1992 | Strothers et al. ................... 204/298.12 |
| 5,215,639 | 6/1993 | Boys . |
| 5,230,459 | 7/1993 | Mueller et al. . |
| 5,342,496 | 8/1994 | Stellrecht ........................... 204/298.12 |
| 5,354,446 | 10/1994 | Kida et al. . |
| 5,391,275 | 2/1995 | Mintz . |
| 5,487,822 | 1/1996 | Demaray et al. ........................ 204/298 |
| 5,507,931 | 4/1996 | Yang . |
| 5,522,535 | 6/1996 | Ivanov et al. ......................... 228/122.1 |
| 5,593,082 | 1/1997 | Ivanov et al. ......................... 228/122.1 |
| 5,632,869 | 5/1997 | Hurwitt et al. . |
| 5,653,856 | 8/1997 | Ivanov et al. . |
| 5,676,803 | 10/1997 | Demaray et al. ................... 204/192.12 |
| 5,827,414 | 10/1998 | Westwood ........................... 204/298.12 |
| 5,836,506 | 11/1998 | Hunt et al. . |
| 5,922,176 | 7/1999 | Caskey ................................ 204/192.12 |
| 5,961,027 | 10/1999 | Szecket .................................... 228/107 |
| 6,033,483 | 3/2000 | Demaray et al. ........................ 118/733 |
| 6,073,830 | 6/2000 | Hunt et al. .............................. 228/203 |

FOREIGN PATENT DOCUMENTS

| | | |
|---|---|---|
| 0575166 | 12/1993 | European Pat. Off. . |
| 0590904 | 4/1994 | European Pat. Off. . |
| 3626470 | 2/1988 | Germany . |
| 59-181623A | 10/1984 | Japan . |
| 62-149866 | 7/1987 | Japan . |
| 1-132761 | 8/1989 | Japan . |
| 2-301855 | 2/1990 | Japan . |
| 2-54761 | 2/1990 | Japan . |
| 2-8364 | 3/1990 | Japan . |

OTHER PUBLICATIONS

John G. Banker et al., "Explosion Welding", *ASM Handbook*, vol. 6, Welding, Brazing and Soldering, pp. 303–305 (1993).

*Primary Examiner*—Patrick Ryan
*Assistant Examiner*—Kiley Stoner
*Attorney, Agent, or Firm*—Blake T. Biederman

[57] ABSTRACT

There is provided a method of forming a high strength atomic bond between a sputter target and backing plate such that the microstructural characteristics of the sputter target material obtained by prior processing is not altered by the bonding process. There is further provided a method for bonding the target to the backing plate and forming a bonded target/backing plate assembly having a greater target thickness for increased sputtering life, while maintaining the overall standard dimensions set by industry standards.

6 Claims, 3 Drawing Sheets

METHOD OF BONDING A SPUTTERING TARGET TO A BACKING PLATE

FIELD OF THE INVENTION

This invention relates to a method of bonding a sputtering target to a backing plate, and more specifically, the use of explosion bonding for manufacturing target/backing plate assemblies.

BACKGROUND OF THE INVENTION

Cathodic sputtering is widely used for the deposition of thin layers of material onto desired substrates. Basically, this process requires a gas ion bombardment of a target having a face formed of a desired material that is to be deposited as a thin film or layer on a substrate. Ion bombardment of the target not only causes atoms or molecules of the target materials to be sputtered, but imparts considerable thermal energy to the target. This heat is dissipated beneath or around a backing plate that is positioned in a heat exchange relationship with the target. The target forms a part of a cathode assembly that, together with an anode, is placed in an evacuated chamber filled with an inert gas, preferably argon. A high voltage electrical field is applied across the cathode and the anode. The inert gas is ionized by collision with electrons ejected from the cathode. Positively charged gas ions are attracted to the cathode and, upon impingement with the target surface, these ions dislodge the target material. The dislodged target material traverses the evacuated enclosure and deposits as a thin film on the desired substrate, which is normally located close to the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent to the target surface, thereby increasing the number of electron-gas atom collisions in the area to produce an increase in the number of positive gas ions in the region that strike the target to dislodge the target material. Accordingly, the target material becomes eroded in a generally annular section of the target face, known as the target raceway.

In a conventional target cathode assembly, the target is attached at a single bonding surface to a nonmagnetic backing plate to form a parallel interface in the assembly. The backing plate is used to provide a means for holding the target assembly in the sputtering chamber and to provide structural stability to the target assembly. Also, the backing plate is normally water-cooled to carry away the heat generated by the ion bombardment of the target. Magnets are typically arranged beneath the backing plate in well-defined positions to form the above-noted magnetic field in the form of a loop or tunnel extending around the exposed face of the target.

To achieve good thermal and electrical contact between the target and the backing plate, these members are commonly attached to each other by use of soldering, brazing, diffusion bonding, mechanical fastening or epoxy bonding.

To a certain extent soft solders can accommodate stresses exerted on the target/backing plate assembly that occur upon cooling. Solder bonds of materials with widely differing thermal expansion rates, however, are susceptible to shear failure initiating at the extreme edges of the bond interface when the solder is too weak for the application. The result commonly experienced is debonding during service. To overcome the problem of joining one or more non-wettable materials by soldering, precoating with a metal is used to enhance solderability. These coatings may be applied by electroplating, sputtering or other conventional means. This need for intermediate coatings applied to target and backing plate materials that are difficult to wet and solder presents problems including adherence reliability of the applied coating and substantial added cost of applying the coating. Furthermore, the relatively low joining temperatures associated with the "soft" solders reduce the temperature range over which the target can be operated during sputtering.

The higher melting temperature solders used for high power applications are stronger but are far less forgiving of the stresses developed in the materials system. Targets of large size present greater stress problems as well as greater difficulty of producing sound bonds across the entire bond surface. As sputtering target sizes and power requirements increase, the soft solders become less applicable for joining of the material systems involved.

Smooth-surface diffusion bonding is an applicable method of bonding, but has only limited use in the bonding of sputtering target components. The bond is produced by pressing the material surfaces into intimate contact while applying heat, to induce metallurgical joining and diffusion to a varying extent across the bond interface. Bonding aids, metal combinations which are more readily joined, are sometimes applied to one or both of the surfaces to be bonded. Such coatings may be applied by electroplating, electroless plating, sputtering, vapor deposition or other usable techniques for depositing an adherent metallic film. It is also possible to incorporate a metallic foil between bonding members that has the ability to be more easily bonded to either of the materials to be joined. The surfaces to be joined are prepared by chemical or other means to remove oxides or their chemical films which interfere with bonding.

Smooth surface diffusion bonding requires extreme care in preparation and in maintaining surface cleanliness prior to and during the bonding operation to ensure reliable bond qualities. Because the diffusion bond interfaces are planar, they are subject to stressing in simple shear which commonly leads to peeling away at the ends of the bond area. The formation of brittle intermetallics at the bond interface, which increase in thickness with the associated long times of heat exposure, add to the potential of bond shear failure. An additional technique for bonding as described in U.S. Pat. No. 5,230,459 includes the pre-bonding step of providing machined grooves in the surface of one of the components to be solid-state bonded. This feature causes disruption of the bond surface of the associated component during heated pressure application. The material having the greater strength or hardness will normally be provided with the grooves such that, during bonding, it will penetrate into the softer member with the softer metal substantially filling the grooves.

Groove bonding is applicable to bonding many dissimilar materials, but is limited to materials that have dissimilar melting temperatures because the process must occur near the melting temperature of the lower melting point alloy. This precludes the use of this technique for similar metals. It is also possible that the saw tooth nature of the grooves may act as a stress concentrator and promote premature cracking in the alloys near the bonds. Furthermore, machining of the grooves is a time consuming operation.

In U.S. Pat. No. 5,836,506, hereby incorporated by reference in its entirety, a method is disclosed for performing a surface roughening treatment to the bonding surface of the sputter target and/or backing plate, followed by solid state bonding. This roughening surface treatment provides 100% surface bonding compared to only 99% surface bonding in the absence of the surface treatment. The treatment further provides a bond with over twice the tensile strength of a bond formed from the non-treated smooth surfaces.

In each of the above bonding processes, elevated temperatures of varying degree are applied to form the bond between the target and backing plate. Thus, in each of these processes, changes in the microstructures of the target and backing plate materials are likely to occur because prolonged exposure of metals to elevated temperatures causes grain growth. Great strides have been made in this art to process sputter target blanks to achieve certain microstructures that are linked to increased sputtering efficiency and improved thin film quality. After a desired microstructure is obtained in the sputter target, it is in jeopardy of being altered by elevated temperature bonding methods for attaching the target to the backing plate.

Furthermore, irrespective of which above-described bonding method is used, conventional target cathode assemblies are limited with respect to the thickness of the target material that may be used to comply with the overall standard dimensions of the assembly as used and understood by the industry. The thickness of the target measured perpendicular to its sputter surface plus the thickness of the backing plate, and the thickness of the backing plate at its periphery, measured in the same direction as that of the target, are set by the industry. Increasing the thickness of the sputter target would make the thickness of the overall assembly too large. Thin targets provide less material for sputtering, and must, therefore, be replaced frequently. Efforts to accomplish greater target thickness without altering the industry accepted dimensions have proved costly and ineffective. For example, the backing plate and target may be a one-piece construction made solely from target material. This allows more target material to be available for sputtering, which decreases the frequency with which the targets must be replaced. The target material, however, is generally expensive. It is thus preferable from a material cost standpoint to provide a two-piece construction with the backing plate made from a less expensive material.

In U.S. patent application Ser. No. 09/172,311, which is a continuation-in-part of U.S. Pat. No. 5,836,506, a surface roughening treatment is applied to side and bottom surfaces of the sputter target, followed by solid state bonding, specifically hot-isostatic pressing, of the target into a recess formed within a backing plate. By embedding the target in the backing plate, this method allows for an increase in target thickness without changing the fixed dimensions of the target/backing plate assembly required by industry standards. However, to do so, it applies elevated temperatures for a time sufficient to alter the microstructures of the assembly materials.

It is thus desirable to develop a method of creating a high strength bond between a sputter target and backing plate without compromising the microstructural characteristics of the sputter target obtained by prior processing.

It is further desirable to create such a bonding method that further allows for an increase in target thickness within the overall standard dimension for target/backing plate assemblies.

SUMMARY OF THE INVENTION

There is provided a method for forming bonded sputter target/backing plate assemblies in which a strong bond is formed between the sputter target and backing plate without substantially changing the microstructure and properties of the materials comprising the sputter target and backing plate. To this end, and in accordance with the principles of the present invention, a sputter target and a backing plate are placed in close proximity to each other and explosion bonded by accelerating the sputter target and/or backing plate toward each other by one or more controlled detonations to form an atomic bond at the interface between the sputter target and backing plate. The non-bonded surfaces of the sputter target and backing plate are then machined to achieve the final assembly dimensions.

Where the target diameter and the backing plate diameter are equal, an outer side portion of the target is machined away after bonding to form a bottom flange portion for securing the sputter target/backing plate assembly in the deposition chamber. The target may be machined down at this outer side portion all the way to the bond interface, such that the flange is comprised only of backing plate material, or in an alternative embodiment, the sputter target may be machined down to a depth above the bond interface, such that the bottom flange portion is comprised of part sputter target and part backing plate material separated by the bond interface. In this latter instance, the useful life of the sputter target is increased by effectively increasing the target thickness, thus providing an extended life sputter target/ backing plate assembly while still maintaining overall standard dimensions.

Where the sputter target to be bonded to the backing plate is smaller in diameter than the backing plate, a ring may be placed around the sputter target such that the bonding face of the sputter target plus ring is equal to the bonding face of the backing plate. After explosion bonding, the ring can then be machined away, leaving a bottom flange portion consisting of backing plate material for securing the assembly within the deposition chamber.

There is thus provided a method for bonding a sputter target to a backing plate in which the bonding method is capable of forming a strong atomic bond without substantially affecting the microstructure of the materials to be bonded, nor their metallurgical and mechanical properties, and in some instances is capable of increasing the life of the sputter target.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

According to the principles of the present invention, a bonded sputter target/backing plate assembly is formed by explosion bonding a sputter target to a backing plate to form a strong atomic bond without altering the prior microstructure of the sputter target and of the backing plate. According to further principles of the present invention, an extended life sputter target/backing plate assembly is formed in conjunction with the principles of explosion bonding.

Figure 1:
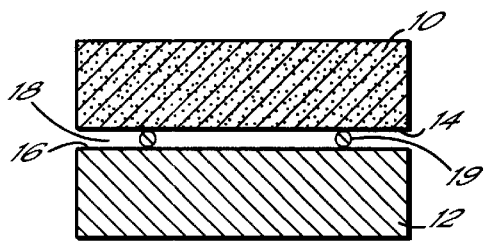
FIG. 1 is a diagrammatic cross-section depicting a first embodiment of a sputter target and backing plate prior to bonding.

Referring to FIG. 1, a sputter target blank 10 may be explosion bonded to a backing plate 12. To this end, a bottom bonding surface 14 of target blank 10 is placed in close proximity to a top bonding surface 16 of backing plate 12. By close proximity is meant that there is a small standoff space 18 between the surfaces 14 and 16. Standoff devices 19, such as thin metal wires and foam blocks, are used to create the standoff space, and are then easily ejected from the system during bonding. Bottom bonding surface 14 and top bonding surface 16 together form the bond interface 20 for the sputter target blank 10 and backing plate 12. To create an atomic bond at the bond interface 20, one or more controlled detonations are produced to accelerate at least one of surfaces 14 and 16 toward the other. This is accomplished by placing explosives 22, generally a granular or liquid explosive substance contained within a box or crate structure, above the sputter target 10, below the backing plate 12, or both.

Figure 2:
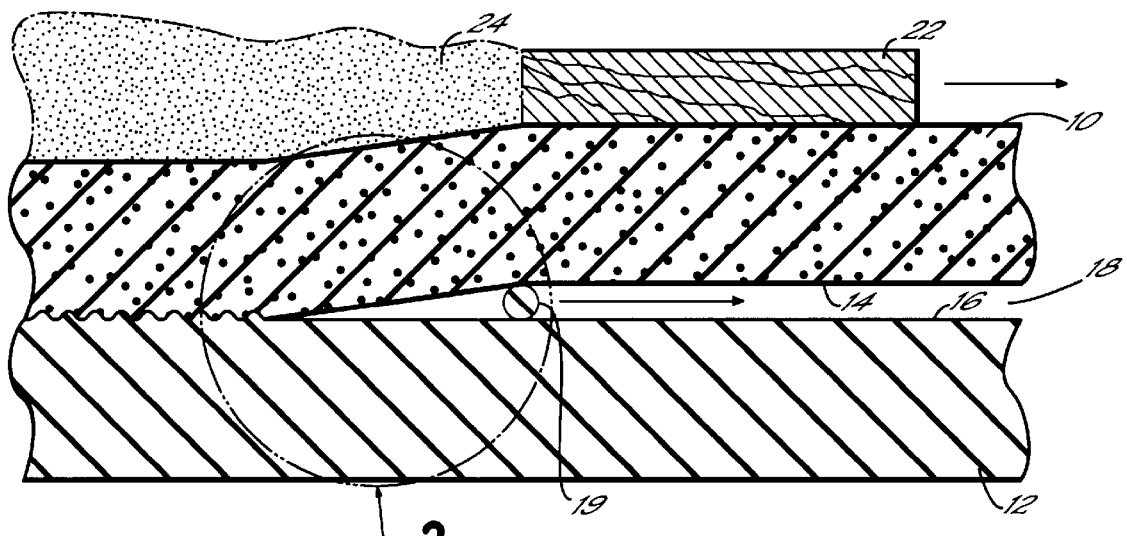
FIG. 2 is a diagrammatic cross-section depicting a sputter target and backing plate in the process of being bonded.
Figure 3:
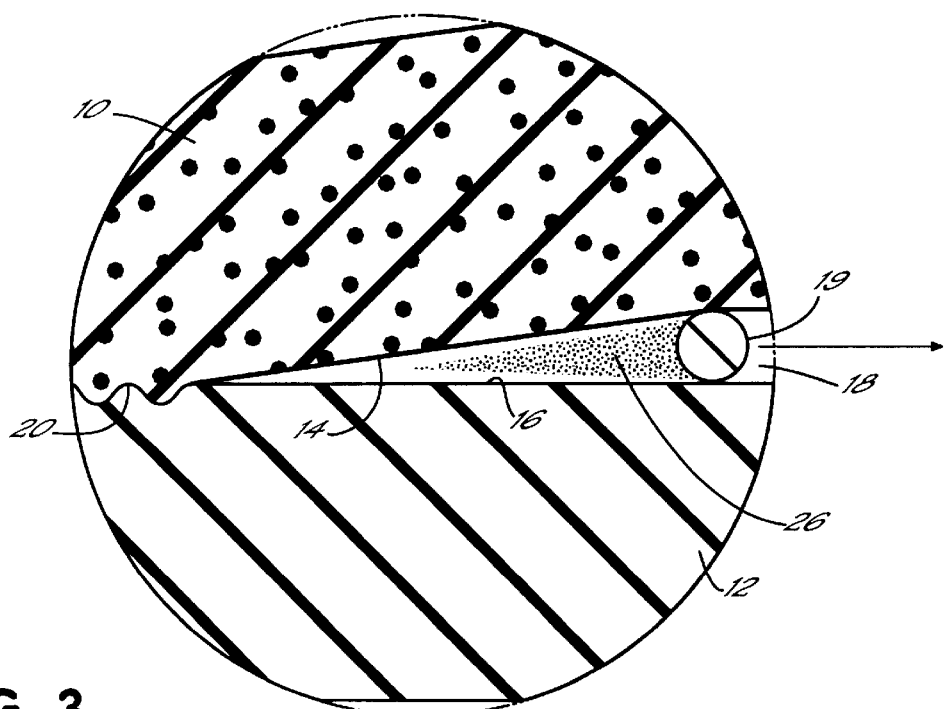
FIG. 3 is an enlarged view of section 3 in FIG. 2.

FIG. 2 and the enlarged view of FIG. 3 depict an embodiment of the explosion bonding process as it is happening. A progressive detonation of explosives 22 above target 10 takes place, from one side of the target 10 to the other, as shown by the arrow, with the force generated by the detonation products 24, such as expanding gas, accelerating target surface 14 toward surface 16 of the backing plate to create bond interface 20. A plasma jet 26 is thereby created between the target 10 and backing plate 12, which ejects the standoff devices 19 from the system.

The required detonation range for explosion bonding is at or below that for most commercially manufactured explosives. Appropriate detonation characteristics can be achieved by one or a combination of commercial explosives such as Amatol, Dynamite, or NCN. Due to the noise and vibration generated by this bonding process, the operation may be performed in a remote geographic location, in a mine or bunker, or in a blast chamber or vacuum chamber.

Figure 4:
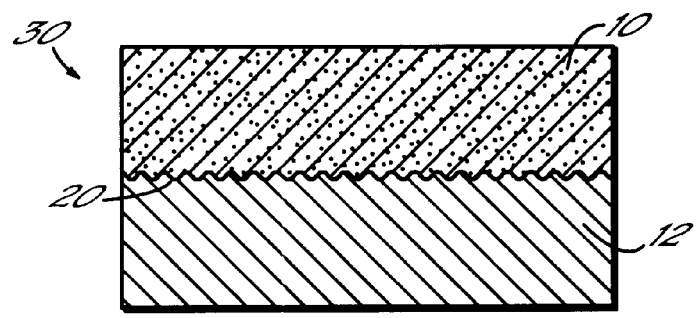
FIG. 4 is a diagrammatic cross-section depicting a bonded sputter target/backing plate assembly of the first embodiment.

After the detonation is completed, a bonded sputter target/backing plate assembly 30 exists, as shown in FIG. 4, having a sputter target 10 bonded at interface 20 to backing plate 12. The bond interface 20 has a wave-type morphology as a result of the explosion bonding process. A strong atomic/metallurgical bond is created between the sputter target 10 and the backing plate 12, but no alteration of the metallurgical properties of the sputter target or backing plate materials results except the localized deformation that is inherent with the wave-type bond interface 20. The explosion bonding process occurs at non-elevated temperatures, and the heat generated from the process is generated for an insufficient time for heat transfer to the component backing and target metals; therefore, there is no appreciable temperature increase in the backing and target metals to produce grain growth.

Figure 5:
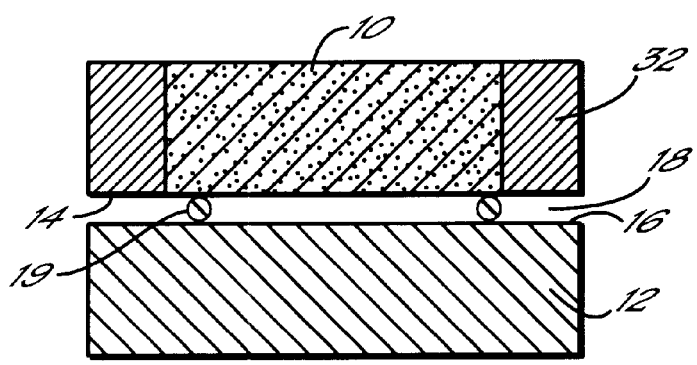
FIG. 5 is a diagrammatic cross-section depicting a second embodiment of a sputter target and backing plate prior to bonding.
Figure 6:
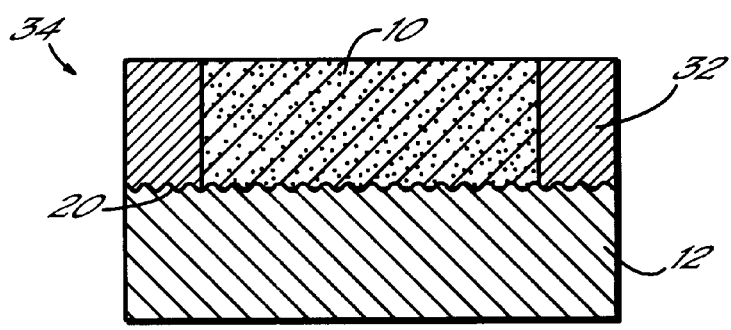
FIG. 6 is a diagrammatic cross-section depicting a bonded sputter target/backing plate assembly of the second embodiment.

Referring to FIG. 5, an alternative embodiment is provided in which the sputter target blank 10 is smaller in diameter than the backing plate 12. During the explosion bonding process, damage to an exposed top surface of the backing plate 12 may be incurred where the sputter target blank 10 is smaller than the backing plate 12. Thus, in this embodiment, a ring 32 is placed around the sputter target 10 so as to effectively increase the diameter of the bottom bonding surface 14 to match that of the top bonding surface 16 of the backing plate 12. The target blank 10 plus ring 32 is then placed in close proximity to the top bonding surface 16 of backing plate 12, and an explosive substance 22 is detonated as described above to form a bonded target/backing assembly 34, as shown in FIG. 6.

Figure 7:
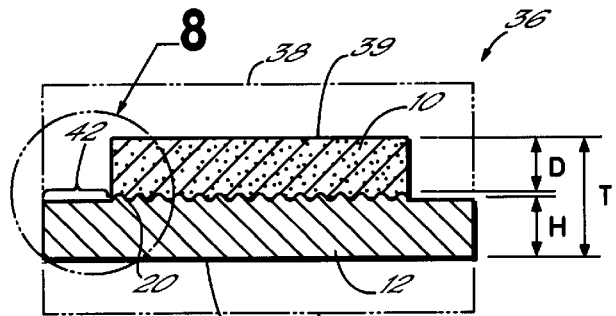
FIG. 7 is a diagrammatic cross-section depicting a bonded sputter target/backing plate assembly of the first or second embodiment, machined to final dimensions.

After the explosion bonding step, the bonded sputter target/backing plate assembly 30 or 34 must be machined to final dimensions as shown in FIG. 7 for insertion into a sputter deposition chamber (not shown). Forming the bonded and machined assembly 36 typically involves machining away a portion of the sputter target blank 10 from its top surface 38 as shown in phantom in FIG. 7 to form a sputter surface 39, and also machining away a portion of the backing plate 12 from its bottom surface 40, also shown in phantom in FIG. 7, to form a machined bottom surface 41. The thickness T from the sputter surface 39 to the machined bottom surface 41 of the backing plate 12 is a fixed dimension set according to industry standards. The machining to final dimensions further includes the formation of a peripheral bottom flange 42 to enable the bonded and machined assembly 36 to be fastened, such as by clamping or screw fastening, into a sputter deposition chamber in the inverted position. In FIG. 7, the peripheral bottom flange 42 consists of the outer edge portion of the backing plate 12, which is exposed to form the flange either by machining away an outer portion from the side edge of sputter target blank 10, as in the case of FIG. 4 where the sputter target diameter is equal to the backing plate diameter, or by machining away the ring 32, as in the case of FIG. 6 where the sputter target diameter is less than the backing plate diameter. In either embodiment, forming flange 42 requires precision machining to locate the bond interface 20. The height H of the flange 42 is also a fixed dimension set by industry standards. The embodiment shown and described in FIG. 7 is similar in configuration to prior art sputter targets/backing plate assemblies where the outer portion of the backing plate serves as the flange, except that a highly strong bond is created in the present invention between assembly components without affecting the microstructure of the component materials.

Figure 8:
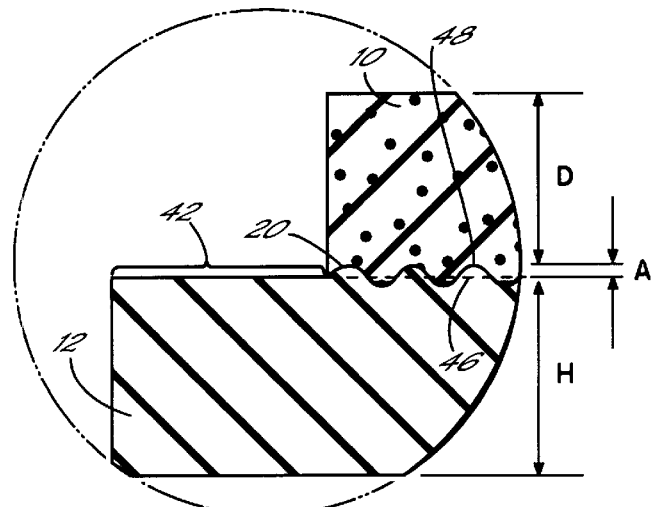
FIG. 8 is an enlarged view of section 8 in FIG. 7.

Referring to FIG. 8, there is shown an enlarged view of the bonded and machined assembly 36 of FIG. 7. The explosion bonding method of the present invention creates a wave-type bond interface 20 with the amplitude A of the wave being approximately 1.0–1.5 mm in standard target/backing plate assemblies. During the deposition process, it is undesirable to sputter all the way through the target, i.e., to sputter a hole through the target 10 to the backing plate 12. In a typical sputter target/backing plate assembly, the target may be sputtered down to the typically horizontal bond interface 46, shown in phantom, or a depth just above the interface 46 before punching through to the backing plate. In an explosion bonded assembly of the present invention, such as assembly 36 shown in enlarged view in FIG. 8, the depth D to which the target may be sputtered is limited by the amplitude A of the wave-type bond interface 20. Thus, in an explosion bonded sputter target/backing plate assembly, the maximum depth D to which the target 10 may be sputtered is to the top 48 of the wave of interface 20, or just above the wave, before punching through to the backing plate 12. Compared to horizontal-type bond interfaces, as shown in phantom in FIG. 8, it is apparent that an amount of usable target material approximately equal to the amplitude A of the wave is forfeited to achieve the strong atomic bond and to maintain the microstructure of the target and backing plate materials.

Figure 9:
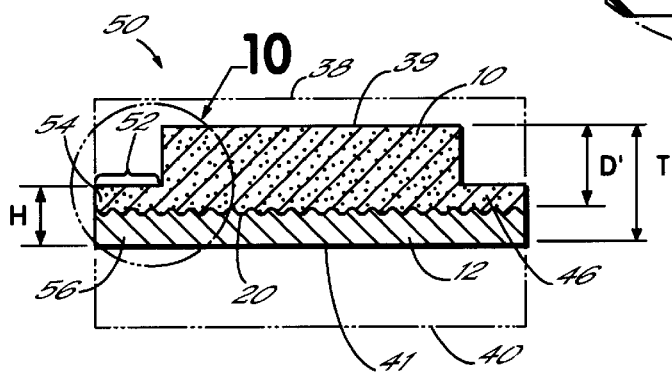
FIG. 9 is a diagrammatic cross-section depicting an extended life bonded sputter target/backing plate assembly of the first embodiment, machined to final dimensions.
Figure 10:
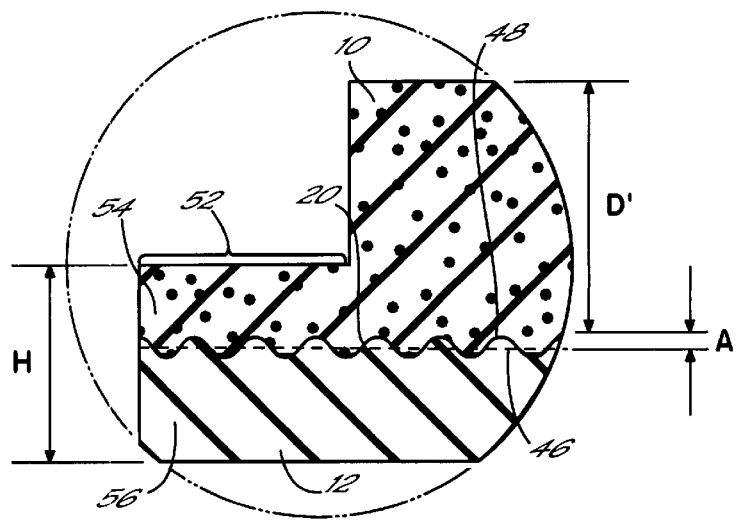
FIG. 10 is an enlarged view of section 10 in FIG. 9.

In an alternative embodiment of bonded and machined assembly 50 of the present invention, shown in FIGS. 9 and 10, in machining the target/backing plate assembly 30 of FIG. 4, a large portion of the backing plate 12 is removed from the bottom 40 (shown in phantom) of the backing plate 12 to form the machined bottom surface 41, and a portion is also removed from the top 38 of the target 10 to form the sputter surface 39. In addition, an outer portion is removed from the side edge of the target blank 10 to create a peripheral bottom flange 52 of height H that consists of a top portion 54 of sputter target material and a bottom portion 56 of backing plate material separated by bond interface 20. The height H of the flange 52 is equal to the height H of the flange 42 in FIG. 7, and thus both embodiments comply with industry standard dimensions. As shown in FIG. 9, and in enlarged view in FIG. 10, the maximum depth D' to which the target 10 may be sputtered is to the top 48 of the wave of interface 20, or just above the wave, before punching through to the backing plate 12. This maximum depth D', however, is greater in FIG. 10 than the maximum depth D in the embodiment in FIG. 8. Thus, target 10 in the embodiment of FIGS. 9 and 10 may be sputtered down to a greater depth and therefore for a longer period of time before punching through to the backing plate material. In effect, the bond interface 20 has been moved downward in the bonded and machined target/backing plate assembly 50 to essentially create a thicker target 10 which may be sputtered for a longer period of time. So by moving the bond interface 20 toward the bottom of the assembly 50, there is formed an extended life sputter target/backing plate assembly. This embodiment conforms with industry standard dimensions, while still enabling use of less expensive backing plate material for a portion of the assembly.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of forming a bonded sputter target/backing plate assembly, comprising the steps of:

providing a backing plate having a top bonding surface;

providing a sputter target having a bottom bonding surface of diameter less than the diameter of the top bonding surface of the backing plate;

providing a ring around the sputter target to increase the diameter of the bottom bonding surface to equal the diameter of the top bonding surface;

explosion bonding the sputter target and ring to the backing plate by accelerating at least one of the top and bottom surfaces toward each other by at least one controlled detonation to form an atomic bond at a bond interface, whereby the microstructure and properties of the materials of the sputter target and the backing plate remain substantially unchanged by the explosion bonding step; and machining away the ring down to the bond interface to form a peripheral flange of a predetermined thickness consisting of the backing plate for securing the bonded sputter target/backing plate assembly in a deposition chamber.

2. The method of claim 1, wherein the sputter target comprises a material selected from the group consisting of: aluminum, titanium, tantalum, tungsten, cobalt, nickel, copper and alloys thereof.

3. The method of claim 1, wherein the backing plate comprises a material selected from the group consisting of: aluminum, copper and metal matrix composites.

4. A method of forming a bonded sputter target/backing plate assembly, comprising the steps of:

providing a sputter target having a bottom bonding surface;

providing a backing plate having a top bonding surface equal in diameter to the bottom bonding surface of the sputter target;

explosion bonding the sputter target to the backing plate by accelerating at least one of the top and bottom surfaces toward each other by at least one controlled detonation to form an atomic bond at a bond interface, whereby the microstructure and properties of the materials of the sputter target and the backing plate remain substantially unchanged by the explosion bonding step; and machining away an outer ring portion of the sputter target down to a depth above the bond interface to form a peripheral flange of predetermined thickness consisting of a top portion being the sputter target and a bottom portion being the backing plate, the top and bottom portions separated by the bond interface, the flange for securing the bonded sputter target/backing plate assembly in a deposition chamber.

5. The method of claim 4, wherein the sputter target comprises a material selected from the group consisting of: aluminum, titanium, tantalum, tungsten, cobalt, nickel, copper and alloys thereof.

6. The method of claim 4, wherein the backing plate comprises a material selected from the group consisting of: aluminum, copper and metal matrix composites.

* * * * *